United States Patent
Fujii et al.

(10) Patent No.: US 9,954,167 B2
(45) Date of Patent: Apr. 24, 2018

(54) MEMORY DEVICE INCLUDING A LAYER INCLUDING HAFNIUM OXIDE AND METHOD FOR MANUFACTURING THE SAME

(71) Applicant: Toshiba Memory Corporation, Minato-ku (JP)

(72) Inventors: Shosuke Fujii, Kuwana (JP); Takayuki Ishikawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/266,181

(22) Filed: Sep. 15, 2016

(65) Prior Publication Data

US 2017/0005261 A1 Jan. 5, 2017

Related U.S. Application Data

(63) Continuation of application No. PCT/JP2015/069052, filed on Jul. 1, 2015.

(30) Foreign Application Priority Data

Sep. 9, 2014 (JP) .................. 2014-183097

(51) Int. Cl.
*H01L 45/00* (2006.01)
*H01L 27/105* (2006.01)
*H01L 49/00* (2006.01)

(52) U.S. Cl.
CPC ............ *H01L 45/14* (2013.01); *H01L 27/105* (2013.01); *H01L 45/00* (2013.01); *H01L 45/12* (2013.01); *H01L 49/00* (2013.01)

(58) Field of Classification Search
CPC ....... H01L 27/105; H01L 45/00; H01L 45/12; H01L 49/00; H01L 45/14; H01L 45/04; (Continued)

(56) References Cited

U.S. PATENT DOCUMENTS

2002/0089005 A1 7/2002 Wickramasinghe et al.
2005/0275003 A1 12/2005 Shinmura
(Continued)

FOREIGN PATENT DOCUMENTS

JP 2000-216349 8/2000
JP 2005-353779 A 12/2005
(Continued)

OTHER PUBLICATIONS

English translation of the International Preliminary Report on Patentability and Written Opinion dated Mar. 23, 2017 in PCT/JP2015/069052.
(Continued)

*Primary Examiner* — Shahed Ahmed
(74) *Attorney, Agent, or Firm* — Oblon, McClelland, Maier & Neustadt, L.L.P.

(57) ABSTRACT

According to one embodiment, a memory device includes a first layer, a second layer, and a third layer provided between the first layer and the second layer. The first layer includes first interconnections and a first insulating portion. The first interconnections extend in a first direction. The first insulating portion is provided between the first interconnections. The second layer includes a plurality of second interconnections and a second insulating portion. The second interconnections extend in a second direction crossing the first direction. The second insulating portion is provided between the second interconnections. The third layer includes a ferroelectric portion and a paraelectric portion. The ferroelectric portion and the paraelectric portion include hafnium oxide.

17 Claims, 9 Drawing Sheets

(58) Field of Classification Search
CPC ............... H01L 27/24; H01L 27/10885; H01L 21/28291; H01L 29/516; H01L 2924/1441; H01L 2224/32245; H01L 2224/48091; H01L 2224/48247
USPC .......................... 257/225, 324; 438/216, 287
See application file for complete search history.

(56) References Cited

U.S. PATENT DOCUMENTS

| | | | |
|---|---|---|---|
| 2012/0091427 A1 | 4/2012 | Chen et al. | |
| 2014/0061570 A1 | 3/2014 | Fujii et al. | |
| 2014/0070290 A1 | 3/2014 | Inumiya et al. | |
| 2014/0319442 A1* | 10/2014 | Hayashi | H01L 45/12 257/2 |
| 2016/0351621 A1* | 12/2016 | Kiyotoshi | H01L 27/105 |
| 2016/0372478 A1* | 12/2016 | Ino | C23C 14/083 |

FOREIGN PATENT DOCUMENTS

| | | |
|---|---|---|
| JP | 2010-251479 A | 11/2010 |
| JP | 2014-53571 | 3/2014 |

OTHER PUBLICATIONS

International Search Report dated Jul. 28, 2015 in PCT/JP2015/069052, filed Jul. 1, 2015 (with English Translation).
Written Opinion dated Jul. 28, 2015 in PCT/JP2015/069052, filed Jul. 1, 2015.
André Chanthbouala, et al., "Solid-State Memories Based on Ferroelectric Tunnel Junctions" Nature Nanotechnology, DOI:10.1038/NNANO.2011.213, vol. 7, Feb. 2012, pp. 101-104.

* cited by examiner

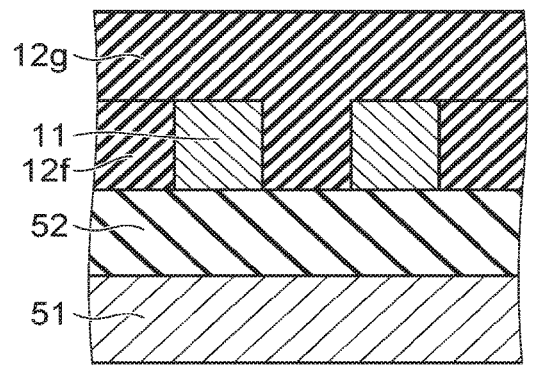 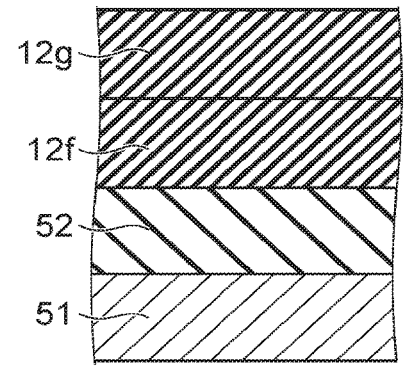
FIG. 5A  FIG. 5B
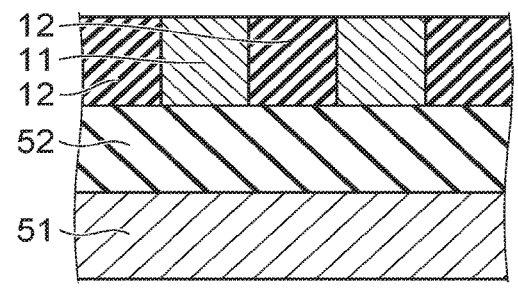 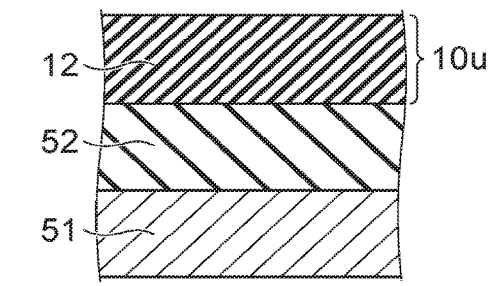
FIG. 6A  FIG. 6B
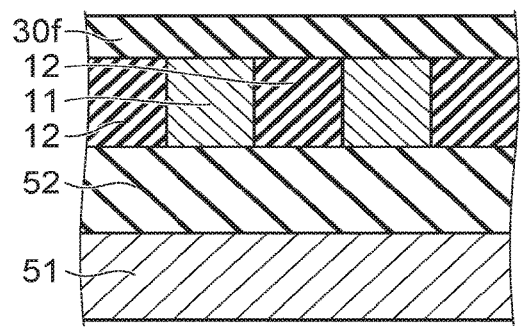 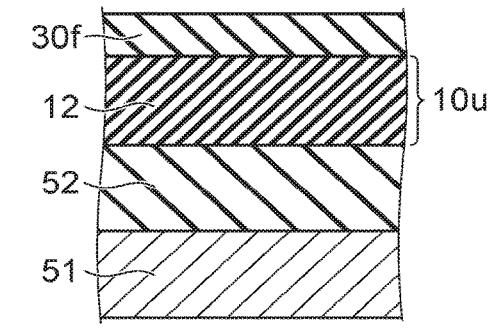
FIG. 7A  FIG. 7B

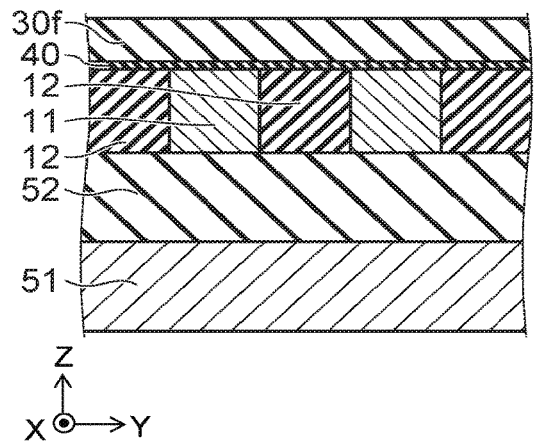 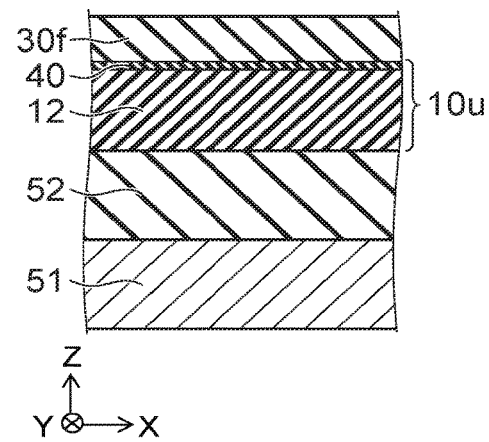
FIG. 17A  FIG. 17B
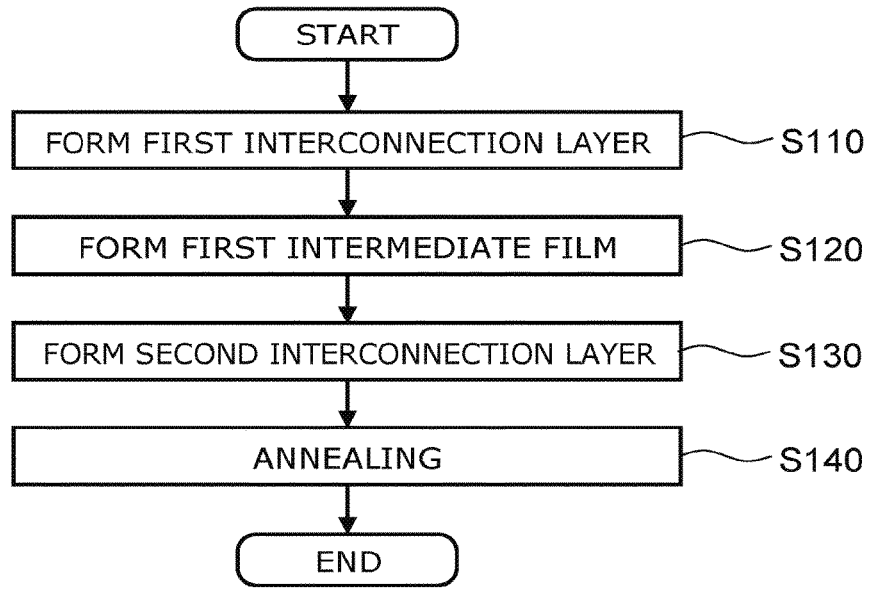
FIG. 18

MEMORY DEVICE INCLUDING A LAYER INCLUDING HAFNIUM OXIDE AND METHOD FOR MANUFACTURING THE SAME

CROSS-REFERENCE TO RELATED APPLICATIONS

This is a continuation application of International Application PCT/JP2015/069052, filed on Jul. 1, 2015. This application also claims priority to Japanese Application No. 2014-183097, filed on Sep. 9, 2014. The entire contents of each are incorporated herein by reference.

FIELD

Embodiments described herein relate generally to a memory device and a method for manufacturing the same.

BACKGROUND

Memory devices using variable resistance elements have been developed. For example, ferroelectric tunnel junction (FJT) elements using a ferroelectric thin film have been proposed. Stable operation is required from memory devices.

BRIEF DESCRIPTION OF THE DRAWINGS

FIG. 5A and FIG. 5B are schematic cross-sectional views illustrating a method for manufacturing the memory device according to the first embodiment;

FIG. 6A and FIG. 6B are schematic cross-sectional views illustrating a method for manufacturing the memory device according to the first embodiment;

FIG. 7A and FIG. 7B are schematic cross-sectional views illustrating a method for manufacturing the memory device according to the first embodiment;

FIG. 17A and FIG. 17B are schematic cross-sectional views illustrating a method of manufacturing the memory device according to the second embodiment; and FIG. 18 is a flowchart illustrating a method for manufacturing a memory device according to a third embodiment.

DETAILED DESCRIPTION

Figure 1A:
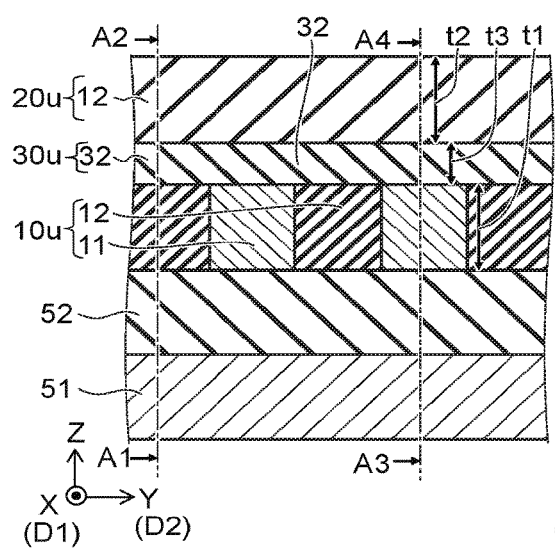
FIG. 1A to FIG. 1D are schematic cross-sectional views illustrating a memory device according to a first embodiment.

According to one embodiment, a memory device includes a first layer, a second layer, and a third layer provided between the first layer and the second layer. The first layer includes a plurality of first interconnections and a first insulating portion. The plurality of first interconnections extend in a first direction and separated from each other in a first crossing direction crossing the first direction. The first insulating portion is provided between the first interconnections. The second layer includes a plurality of second interconnections and a second insulating portion. The plurality of second interconnections extend in a second direction crossing the first direction. The second interconnections are separated from each other in a second crossing direction crossing the second direction. The second insulating portion is provided between the second interconnections. The second layer is separated from the first layer in a third direction crossing the first direction and the first crossing direction. The third layer includes a ferroelectric portion and a paraelectric portion. The ferroelectric portion includes a first material including hafnium oxide. The ferroelectric portion is provided between the first interconnections and the second interconnections. The paraelectric portion includes a second material including hafnium oxide. The paraelectric portion is provided between the first insulating portion and the second interconnections, is provided between the second insulating portion and the first interconnections, and is provided between the first insulating portion and the second insulating portion.

According to one embodiment, a method for manufacturing a memory device includes forming a first layer. The first layer includes a plurality of first interconnections extending in a first direction and separated from each other in a first crossing direction crossing the first direction, and a first insulating portion provided between the first interconnections. The method includes forming a film including hafnium oxide on the first layer. The method includes forming the second layer on the film. The second layer includes a plurality of second interconnections and a second insulating portion. The second interconnections extend in a second direction crossing the first direction. The second interconnections are separated from each other in a second crossing direction crossing the second direction. The second insulating portion is provided between the second interconnections. The method includes annealing the first layer, the film, and the second layer to form a ferroelectric portion and a paraelectric portion from the film. The ferroelectric portion is provided between the first interconnections and the second interconnections. The paraelectric portion is provided between the first insulating portion and the second interconnections, is provided between the second insulating portion and the first interconnections, and is provided between the first insulating portion and the second insulating portion.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A to FIG. 1D are schematic cross-sectional views illustrating a memory device according to a first embodiment.

Figure 1B:
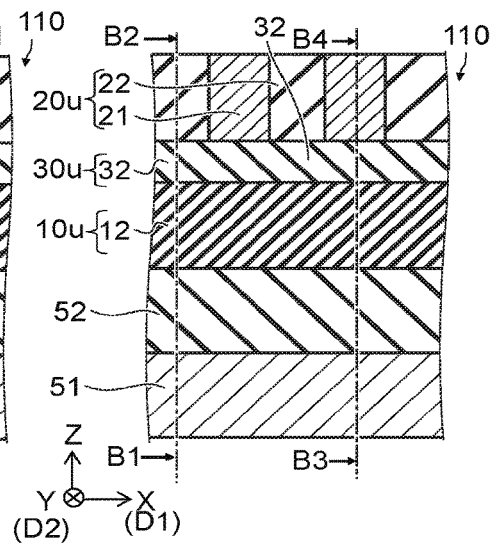
Figure 1C:
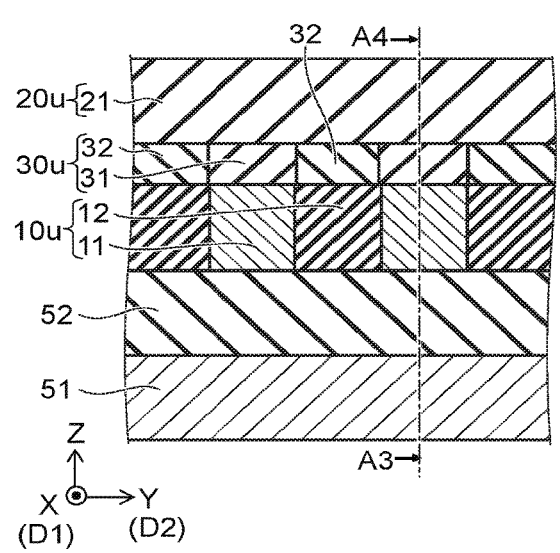
Figure 1D:
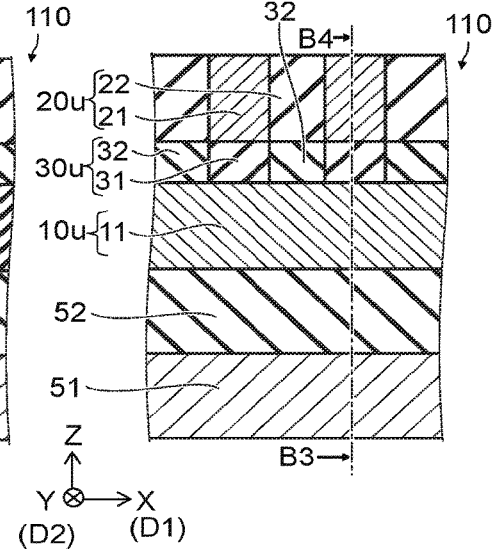

FIG. 1A is a cross-sectional view through B1-B2 in FIG. 1B. FIG. 1B is a cross-sectional view through A1-A2 in FIG. 1A. FIG. 1C is a cross-sectional view through B3-B4 in FIG. 1B. FIG. 1D is a cross-sectional view through A3-A4 in FIG. 1A.

A memory device 110 according to the embodiment includes a first layer 10u, a second layer 20u, and a third layer 30u.

The first layer 10u includes a plurality of first interconnections 11, and a first insulating portion 12. Each of the first interconnections 11 extends in a first direction D1.

The first direction D1 is, for example, the X-axis direction. One direction perpendicular to the X-axis direction is defined as the Y-axis direction. The direction perpendicular to the X-axis direction and the Y-axis direction is defined as the Z-axis direction.

The plurality of first interconnections 11 are separated from each other in a direction that crosses the first direction D1 (first crossing direction). In this example, the plurality of first interconnections 11 are separated from each other in a direction perpendicular to the first direction D1 (Y-axis direction).

The first insulating portion 12 is provided between the plurality of the first interconnections 11.

The second layer 20u is separated from the first layer 10u in a third direction (for example, the stacking direction). The third direction (stacking direction) is a direction that crosses a direction that crosses the first direction D1 (the first crossing direction, for example the Y-axis direction), and, the first direction D1. For example, the third direction (stacking direction) is the Z-axis direction. The second layer 20u includes a plurality of second interconnections 21, and a second insulating portion 22.

Each of the plurality of second interconnections 21 extends in a second direction D2 that crosses the first direction D1. In this example, the second direction D2 is the Y-axis direction. The plurality of second interconnections 21 are separated from each other in a direction that crosses the second direction D2 (second crossing direction).

The second insulating portion 22 is provided between the plurality of the second interconnections 21.

The first interconnections 11 function as, for example, one of the bit lines and the word lines of the memory device 110. The second interconnections 21 function as, for example, the other of the bit lines and the word lines of the memory device 110.

For the first insulating portion 12 and the second insulating portion 22, an insulator such as silicon oxide is used, for example.

The third layer 30u is provided between the first layer 10u and the second layer 20u. The third layer 30u includes a ferroelectric portion 31 and a paraelectric portion 32. The ferroelectric portion 31 is provided between each of the plurality of first interconnections 11 and each of the plurality of second interconnections 21. The ferroelectric portion 31 includes a material that includes hafnium oxide ($HfO_x$, where x is 1 or 2). The resistance of the ferroelectric portion 31 can be varied. For example, the resistance of the ferroelectric portion 31 varies in accordance with the voltage applied between the first interconnections 11 and the second interconnections 21. In the memory device 110, the ferroelectric portion 31 functions as a cell for storing information.

The paraelectric portion 32 is provided between the first insulating portion 12 and the plurality of second interconnections 21, between the second insulating portion 22 and the plurality of first interconnections 11, and between the first insulating portion 12 and the second insulating portion 22. The paraelectric portion 32 includes the material used in the ferroelectric portion 31. In other words, the same material is used in the ferroelectric portion 31 and the paraelectric portion 32 (a material that includes at least hafnium oxide). The paraelectric portion 32 functions as an insulating portion separating the cells (ferroelectric portions 31).

The ferroelectric portion 31 and the paraelectric portion 32 are mutually continuous. The ferroelectric portion 31 and the paraelectric portion 32 are not separated from each other. In the third layer 30u, the ferroelectric portion 31 and the paraelectric portion 32 are not patterned.

The memory device 110 is, for example, a cross-point type of memory device. The memory device 110 is, for example, a non-volatile memory device.

In this example, an interlayer insulating film 52 (for example, a silicon oxide film) is provided on a substrate 51 (for example, a silicon substrate). The first layer 10u, the third layer 30u, and the second layer 20u are provided on the interlayer insulating film 52 in that order. In the embodiment, the second layer 20u, the third layer 30u, and the first layer 10u may be provided on the interlayer insulating film 52 in that order. The first layer 10u and the second layer 20u are interchangeable. The substrate 51 and the interlayer insulating film 52 may be provided when necessary.

As described above, the same material is used in the ferroelectric portion 31 and the paraelectric portion 32 (a material that includes at least hafnium oxide). Also the ferroelectric portion 31 has ferroelectric properties. Also the paraelectric portion 32 has paraelectric properties. A difference in dielectric properties is produced by a difference in the crystal structure.

The crystal structure of the ferroelectric portion 31 is different from the crystal structure of the paraelectric portion 32. For example, the ferroelectric portion 31 has an orthorhombic crystal structure. In this way, the ferroelectric properties can be obtained in the ferroelectric portion 31 that is mainly hafnium oxide. On the other hand, the paraelectric portion 32 has a monoclinic crystal structure. Paraelectric properties can be obtained in the paraelectric portion 32 that is mainly hafnium oxide having this crystal structure.

When a material including hafnium oxide has an orthorhombic crystal structure, in some cases, the crystal structure has no centrosymmetry. In the embodiment, for example, the orthorhombic crystal structure may be an orthorhombic crystal structure with no centrosymmetry. Information regarding the crystal structure of the ferroelectric portion 31 and the crystal structure of the paraelectric portion 32 can be obtained by, for example, X-ray diffraction.

The dielectric constant of the ferroelectric portion 31 is higher than the dielectric constant of the paraelectric portion 32. In the embodiment, the dielectric constant of the intercell region where the paraelectric portion 32 is provided (between the first insulating portion 12 and the plurality of second interconnections 21, between the second insulating portion 22 and the plurality of first interconnections 11, and between the first insulating portion 12 and the second insulating portion 22) is lower than that of the cells (ferroelectric portion 31). In this way, interference between adjacent cells can be suppressed. Also, leakage between bit lines and between word lines can be suppressed. In this way, high operational stability can be obtained. In other words, high operational stability can be obtained even when the cell size is reduced and the memory density is increased. In other words, high operational stability can be maintained even when the cell size is reduced and the memory density is increased.

In the memory device 110 according to the embodiment, the third layer 30u is continuous, which does not require patterning. A region of a portion of the third layer 30u becomes the ferroelectric portion 31 (cell). The other region becomes the paraelectric portion 32, which separates the cells. In the embodiment, patterning is not necessary, so high productivity can be obtained.

For example, in the process of manufacturing the memory device 110, annealing is carried out. As a result of this annealing, stress is applied to the film (hafnium oxide film or the like) that will become the third layer 30u. This stress is different in the regions between the first interconnections 11 and the second interconnections 21, and the other regions. It is considered that this difference in stress causes the difference in crystal structure in the ferroelectric portion 31 and the paraelectric portion 32.

In the embodiment, the plurality of the first interconnections 11 and the plurality of the second interconnections 21 include TiN. By using such a material, the difference in crystal structure of the third layer 30u can be stably produced.

In the embodiment, in addition to hafnium oxide, the material used in the ferroelectric portion 31 and the paraelectric portion 32 may further include at least one element selected from the group consisting of Si, Al, Zr, Gd, Y, and Sr.

The thickness t1 (length in the Z-axis direction) of the first layer 10u is, for example, not less than 10 nanometers (nm). In other words, the thickness of the first interconnection 11 and the thickness of the first interconnection 12 are not less than 10 nm. The thickness of the first interconnection 11 and the thickness of the first insulating portion 12 are, for example, not less than 50 and not more than 500 nm. When the first interconnection 11 is thick, the resistance of the first interconnection 11 can be reduced. If the first interconnection 11 is too thin, the resistance is increased excessively. If the first insulating portion 12 is excessively thin, for example, in some cases, the stress applied to the paraelectric portion 32 is not maintained in the desired state. When the thickness of the first interconnection 11 and the thickness of the first insulating portion 12 are, for example, not less than 10 nm, the stress produced in the third layer 30u can be easily controlled.

Likewise, the thickness t2 of the second layer 20u is, for example, not less than 10 nm. In other words, the thickness of the second interconnection 21 and the thickness of the second insulating portion 22 are not less than 10 nm. These thicknesses are, for example, not less than 50 and not more than 500 nm.

On the other hand, the thickness t3 of the third layer 30u is not less than 1 and not more than 50 nm. When the thickness t3 is less than 1 nm, there is significant variation in the characteristics of the element, so the operation is unstable. When the thickness t3 exceeds 50 nm, the resistance of the ferroelectric portion 31 increases excessively. The reading current becomes excessively small, and operation becomes unstable.

In this example, each of the plurality of first interconnections 11 is in contact with the ferroelectric portion 31. Also, each of the plurality of second interconnections 21 is in contact with the ferroelectric portion 31. As described later, a fourth layer may be provided between the ferroelectric portion 31 and either of the first interconnections 11 or the second interconnections 21.

The following is a description of an example of a method for manufacturing the memory device 110.

FIG. 2A to 12B are schematic cross-sectional views illustrating a method for manufacturing the memory device according to the first embodiment.

Figure 2A:
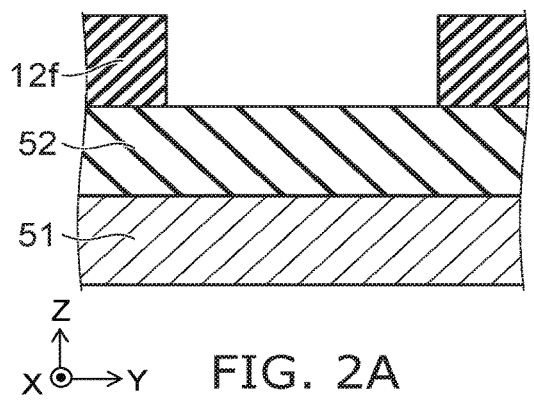
FIG. 2A and FIG. 2B are schematic cross-sectional views illustrating a method for manufacturing the memory device according to the first embodiment.
Figure 2B:
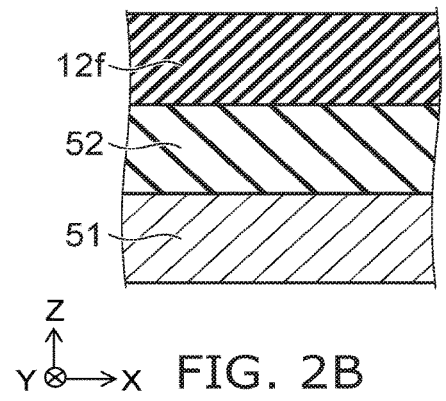

FIG. 2A and FIG. 2B correspond to the cross-sections illustrated in FIG. 1A and FIG. 1B, respectively. The other drawings are also cross-sectional views corresponding to FIG. 1A and FIG. 1B.

As illustrated in FIG. 2A and FIG. 2B, the interlayer insulating film 52 is formed on the substrate 51. Then a first insulating film 12f that will form a portion of the first insulating portion 12 is formed, and patterned in a predetermined shape. Silicon oxide is, for example, used as in the first insulating film 12f.

Figure 3A:
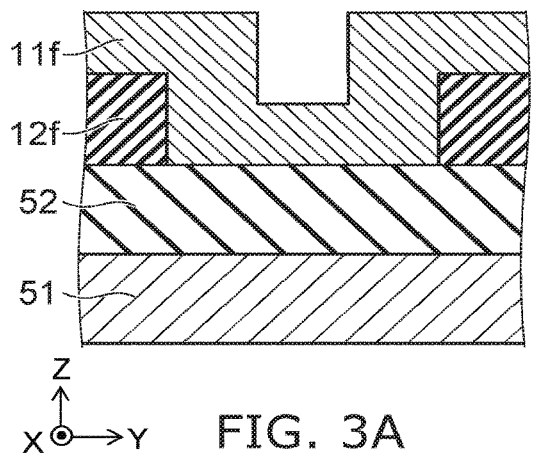
FIG. 3A and FIG. 3B are schematic cross-sectional views illustrating a method for manufacturing the memory device according to the first embodiment.
Figure 3B:
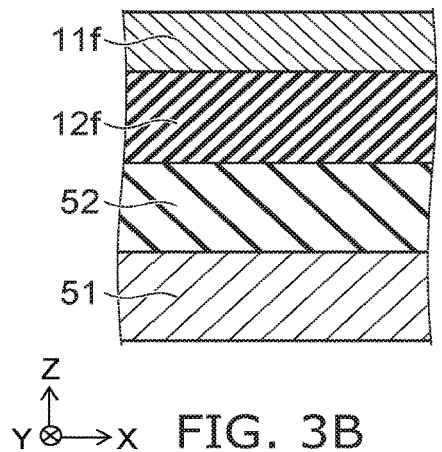

As illustrated in FIG. 3A and FIG. 3B, a first interconnection film 11f that will form the first interconnection 11 is formed. For example, the chemical vapor deposition (CVD) method can be used.

Figure 4A:
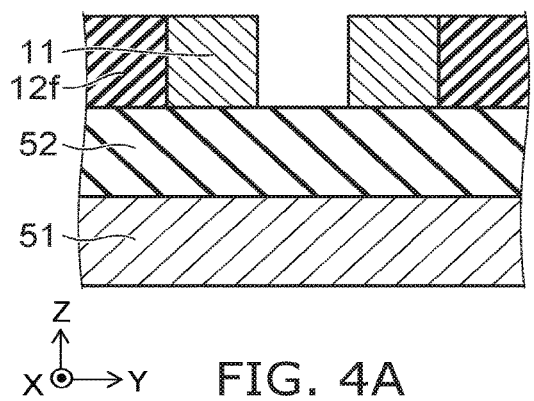
FIG. 4A and FIG. 4B are schematic cross-sectional views illustrating a method for manufacturing the memory device according to the first embodiment.
Figure 4B:
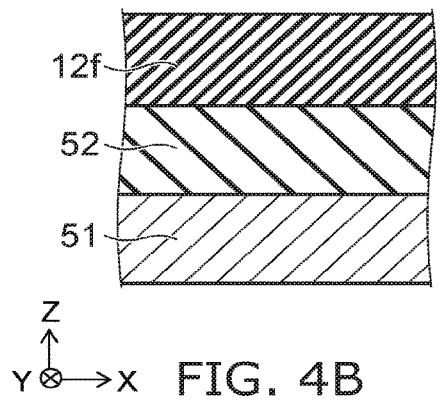

As illustrated in FIG. 4A and FIG. 4B, the first interconnection film 11f is cut back. At this time, anisotropic etching is carried out. For example, the reactive ion etching (RIE) method can be used. In this way the plurality of first interconnections 11 are obtained. Recesses are formed between the plurality of first interconnections 11.

As illustrated in FIG. 5A and FIG. 5B, the recesses are filled with a first insulating film 12g that will form another portion of the first insulating portion 12. For the first insulating film 12g, silicon oxide may, for example, be used.

As illustrated in FIG. 6A and FIG. 6B, a portion of the first insulating film 12g is removed and flattened by, for example, chemical mechanical polishing (CMP). The first insulating portion 12 is formed from the first insulating film 12f and the second insulating film 12g. Thereby, the first layer 10u is formed.

As illustrated in FIG. 7A and FIG. 7B, a film 30f that will form the third layer 30u is formed on the first layer 10u. Hafnium oxide may, for example, be used in the film 30f. As stated above, another element may also be added.

Figure 8A:
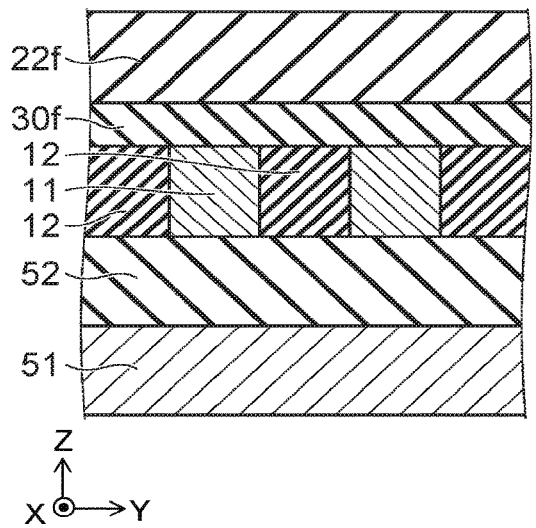
FIG. 8A and FIG. 8B are schematic cross-sectional views illustrating a method for manufacturing the memory device according to the first embodiment.
Figure 8B:
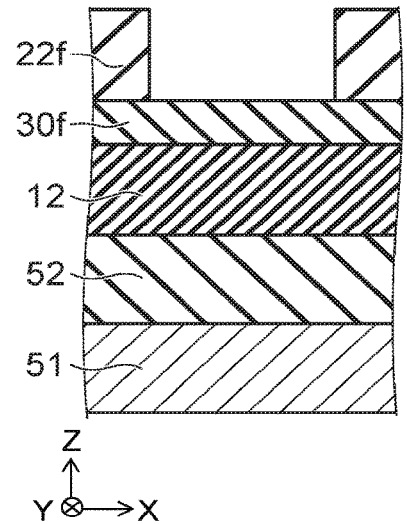

As illustrated in FIG. 8A and FIG. 8B, a second insulating film 22f that will form a portion of the second insulating portion 22 is formed on the film 30f, and patterned in a predetermined shape. Silicon oxide may, for example, be used in the second insulating film 22f.

Figure 9A:
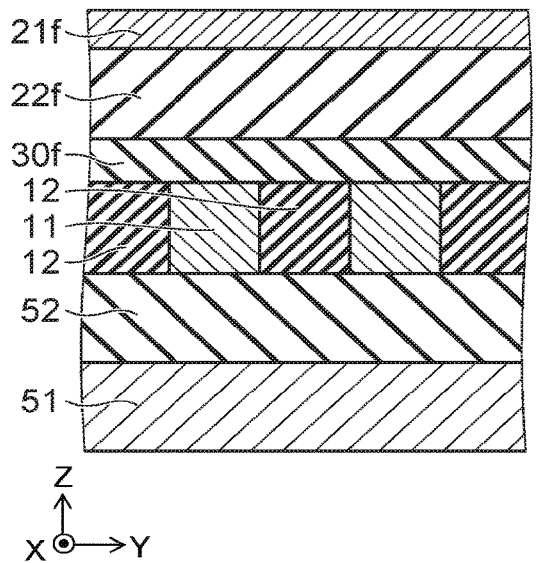
FIG. 9A and FIG. 9B are schematic cross-sectional views illustrating a method for manufacturing the memory device according to the first embodiment.
Figure 9B:
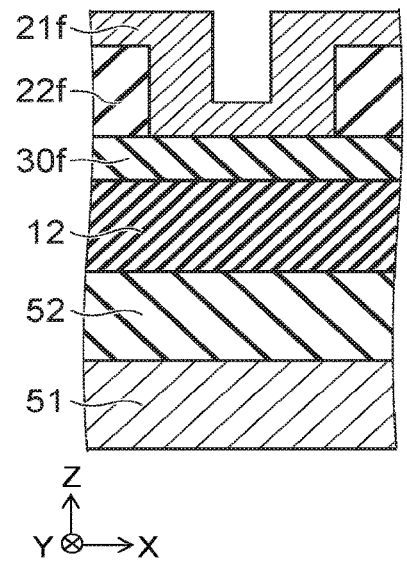

As illustrated in FIG. 9A and FIG. 9B, a second interconnection film 21f that will form the second interconnection 21 is formed. For example, the CVD method may be used.

Figure 10A:
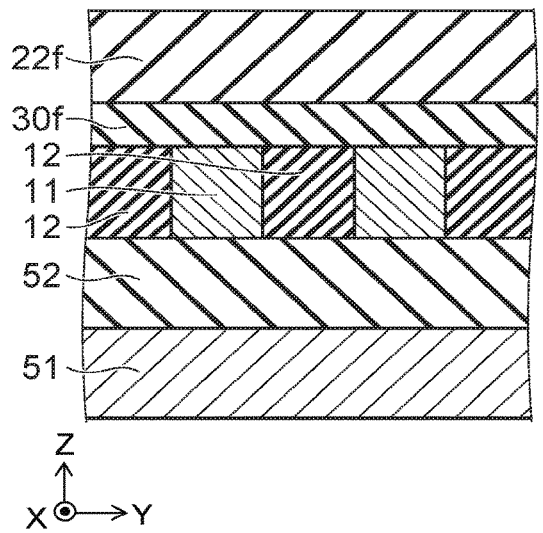
FIG. 10A and FIG. 10B are schematic cross-sectional views illustrating a method for manufacturing the memory device according to the first embodiment.
Figure 10B:
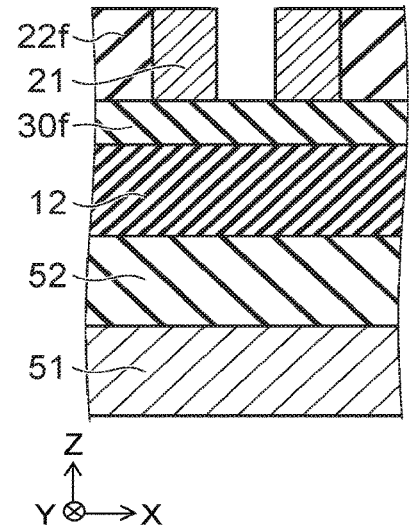

As illustrated in FIG. 10A and FIG. 10B, the second interconnection film 21f is cut back. For example, anisotropic etching is carried out by the RIE method. In this way the plurality of second interconnections 21 are obtained. Recesses are formed between the plurality of second interconnections 21.

Figure 11A:
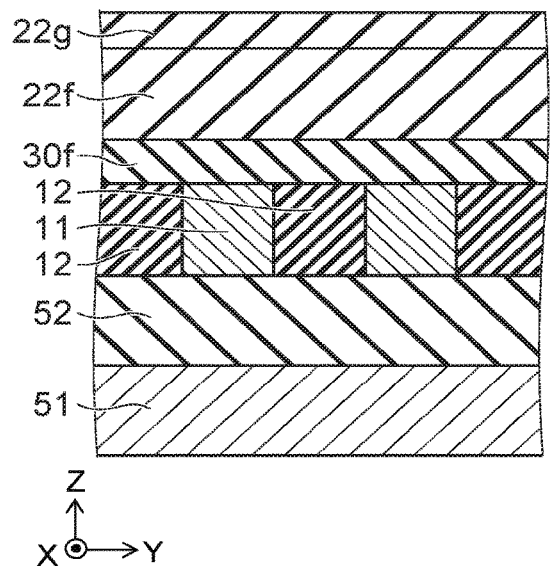
FIG. 11A and FIG. 11B are schematic cross-sectional views illustrating a method for manufacturing the memory device according to the first embodiment.
Figure 11B:
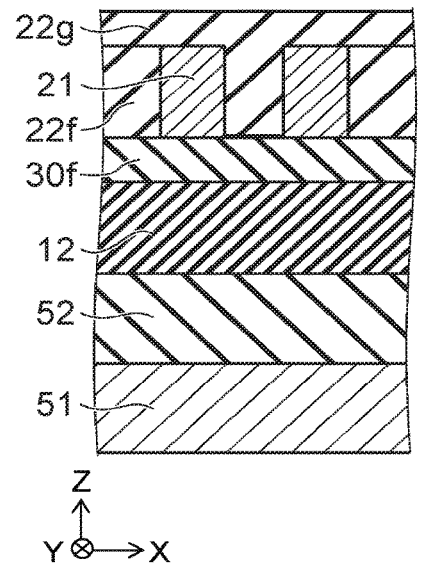

As illustrated in FIG. 11A and FIG. 11B, the recesses are filled with a second insulating film 22g that will form another portion of the second insulating portion 22. For the second insulating film 22g, silicon oxide may, for example, be used.

Figure 12A:
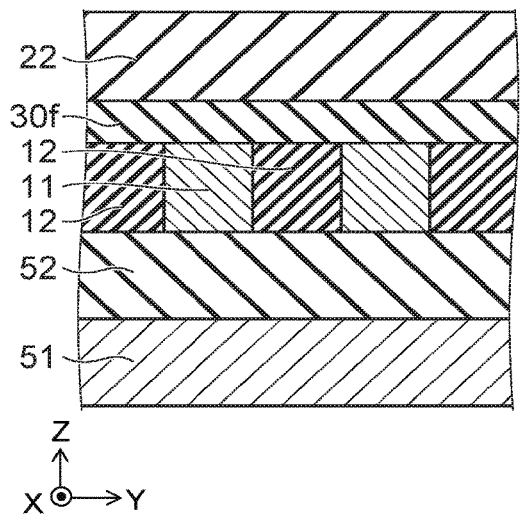
FIG. 12A and FIG. 12B are schematic cross-sectional views illustrating a method for manufacturing the memory device according to the first embodiment.
Figure 12B:
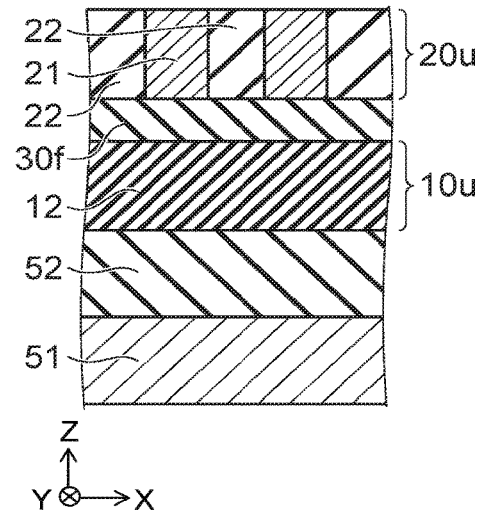

As illustrated in FIG. 12A and FIG. 12B, a portion of the second insulating film 22g is removed and flattened by, for example, CMP. The second insulating portion 22 is formed from the second insulating film 22f and the second insulating film 22g. Thereby, the second layer 20u is formed.

In this state, annealing is carried out. In other words, the film 30f is heated to carry out crystallization annealing. The heating temperature is, for example, not lower than 900 and not higher than 1,100° C. (for example 1,000° C.). The duration of the annealing is, for example, not less than 5 and not more than 30 seconds (for example, 10 seconds). The heating temperature may be not less than 600 and not more than 1,100° C.

In this way, the region of the film 30f between the first interconnections 11 and the second interconnections 21 becomes orthorhombic crystalline. The other regions become, for example, monoclinic crystalline. In this way, mutually different crystalline structures are formed in the regions between the first interconnections 11 and the second interconnections 21, and in the other regions.

During the crystallization, a strong stress is applied to the portion between the upper and lower interconnections. The strain becomes large. The stress applied to the other portions is comparatively small. The strain is small. The crystalline structure becomes orthorhombic in the portion where the strong strain is produced, and becomes monoclinic in the other portions. When the crystalline structure is orthorhombic, the hafnium oxide exhibits ferroelectric properties. When the crystalline structure is other than orthorhombic, ferroelectric properties are not produced.

As a result of this annealing, the memory device 110 according to the embodiment can be formed.

In the memory device 110, insulation is provided between adjacent cells using paraelectric hafnium oxide. Therefore crosstalk between adjacent cells is suppressed.

The relative permeability of monoclinic crystals is lower than the relative permeability of orthorhombic crystals. Therefore crosstalk due to capacitive coupling between adjacent cells is suppressed. Therefore operation is stabilized, and a high memory density can be obtained.

Also, as described above, each of the cells can be formed without patterning a variable resistance material. In this way, high productivity can be obtained.

For example, if a variable resistance layer is formed at the points of intersection of the plurality of interconnections in a reference example, pillar-shaped variable resistance layers are formed corresponding to each of the points of intersection. In contrast, by using the method as described above, the required cells can be formed at the points of intersection, without processing into pillar shapes.

According to the embodiment, processing of the variable resistance layer can be omitted. The manufacturing process can be shortened, and the memory device can be formed more conveniently.

In the embodiment, the third layer 30u has, for example, a polycrystalline structure.

In the embodiment, for example, elements such as the transistors of the peripheral circuits of the memory device may be formed on the Si substrate 51. In this case, interconnections (not illustrated on the drawings) that connect the elements on the substrate 51 and the memory device 110 are formed in the interlayer insulating film 52.

Figure 13A:
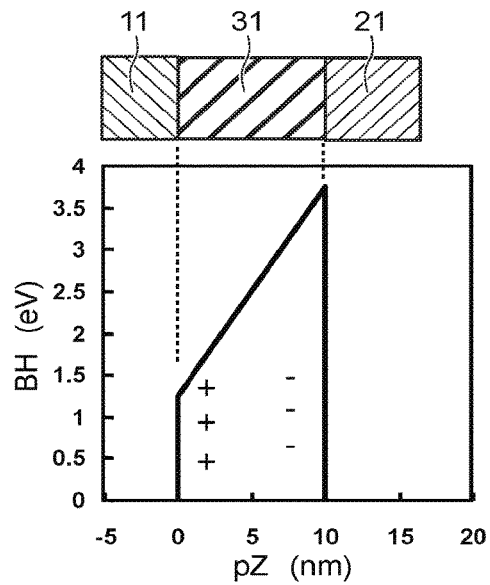
FIG. 13A and FIG. 13B are graphs showing the characteristics of the memory device according to the first embodiment.
Figure 13B:
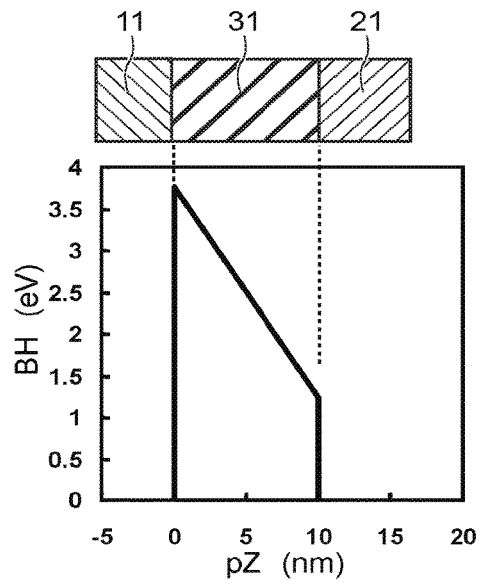

FIGS. 13A and 13B are graphs showing the characteristics of the memory device according to the first embodiment.

These graphs show the barrier height BH (eV) in the ferroelectric portion 31 when a voltage is applied between the first interconnections 11 and the second interconnections 21. The horizontal axis shows the position pZ in the Z-axis direction. In these graphs, the polarization directions of the ferroelectric portions are different from each other.

In the ferroelectric portion 31, the shape of the barrier height BH varies with the polarization direction. The barrier height BH changes at the interface between the ferroelectric portion 31 and the first interconnections 11, and at the interface between the ferroelectric portion 31 and the second interconnections 21. As a result of this change, the electrical resistance of the ferroelectric portion 31 is changed.

In the embodiment, besides TiN, TaN or WN may be used in the plurality of the first interconnections 11 and the plurality of the second interconnections 21.

Second Embodiment

FIG. 14A to FIG. 14D are schematic cross-sectional views illustrating a memory device according to a second embodiment.

Figures 14A, 14B:
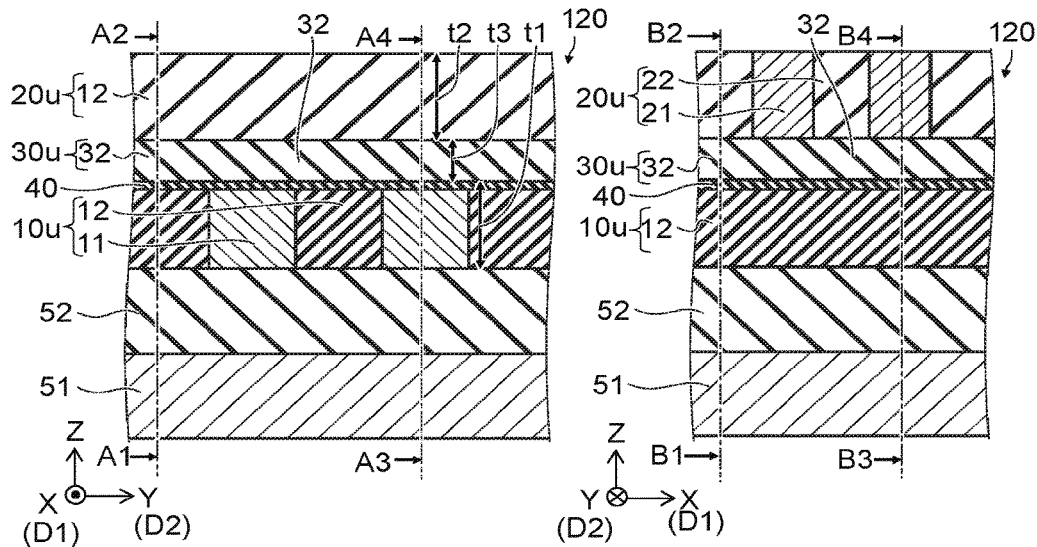
FIG. 14A to FIG. 14D are schematic cross-sectional views illustrating a memory device according to a second embodiment.
Figures 14C, 14D:
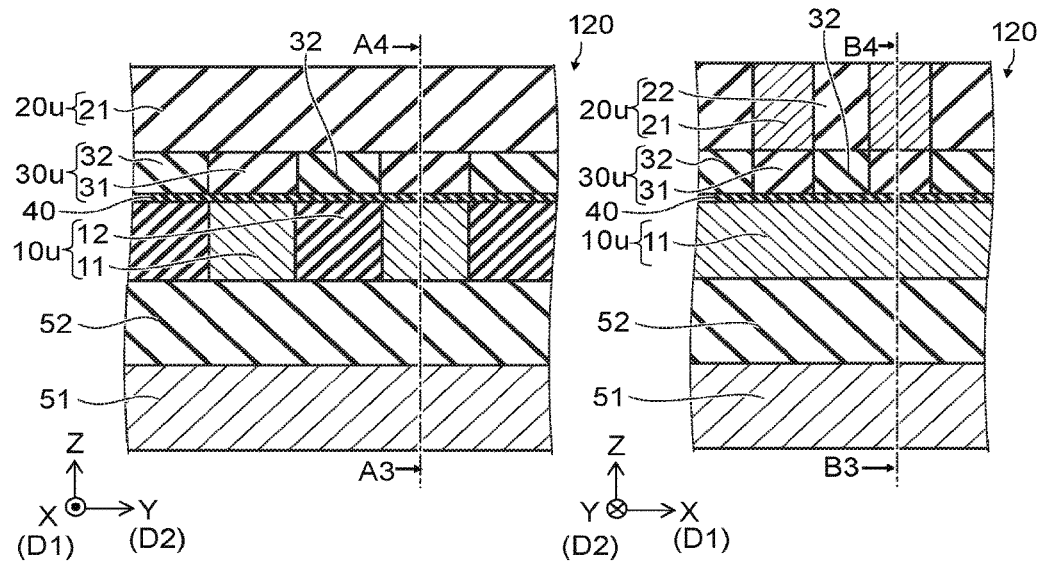

FIG. 14A is a cross-sectional view through B1-B2 in FIG. 14B. FIG. 14B is a cross-sectional view through A1-A2 in FIG. 14A. FIG. 14C is a cross-sectional view through B3-B4 in FIG. 14B. FIG. 14D is a cross-sectional view through A3-A4 in FIG. 14A.

A memory device 120 according to the embodiment further includes a fourth layer 40 in addition to the first layer 10u, the second layer 20u, and the third layer 30u. Otherwise, the configuration is the same as that of the memory device 110, and the description thereof is omitted. The memory device 120 is, for example, a non-volatile memory device.

In this example, the fourth layer 40 is provided between the first layer 10u and the third layer 30u. As described previously, the first layer 10u and the second layer 20u are interchangeable. Therefore, the fourth layer 40 may be provided between the second layer 20u and the third layer 30u.

The thickness of the fourth layer 40 is not less than 0.5 and not more than 2.0 nm. An insulator such as silicon oxide is used, for example, in the fourth layer 40. The fourth layer 40 is thin, so it can function as a tunnel insulating film.

In the embodiment, a silicon oxide film, for example, is used for the fourth layer 40 (paraelectric layer). In addition, a silicon nitride film or a silicon oxynitride film may be used. In addition, an oxide of at least any one of the group of elements consisting of Ta, Ti, La, and Al may be used in the fourth layer 40. A nitride containing at least any one of the above group of elements may also be used. An oxynitride containing at least any one of the above group of elements may also be used.

In the memory device 120, interference between adjacent cells can be suppressed. Also leakage between bit lines and between word lines can be suppressed. In this way, high operational stability can be obtained. Also high productivity can be obtained.

By providing the fourth layer 40, rectification characteristics are provided as described below.

Figures 15A, 15B:
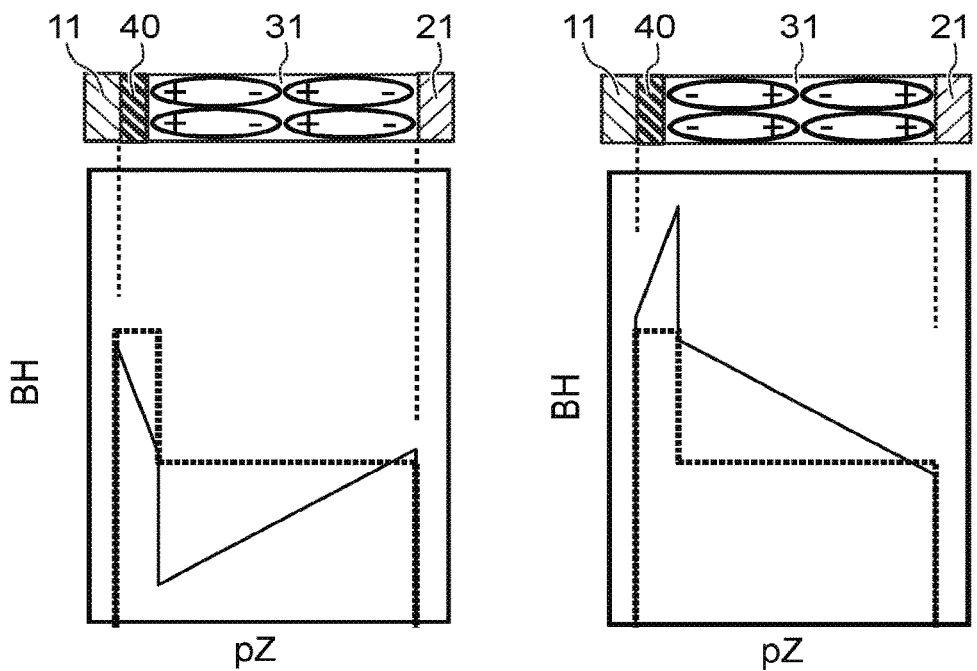
FIGS. 15A and 15B are graphs showing the characteristics of the memory device.

FIGS. 15A and 15B are graphs showing the characteristics of the memory device.

These graphs show the barrier height BH (eV) in the ferroelectric portion 31 when a voltage is applied between the first interconnections 11 and the second interconnections 21 in the memory device 120. In these graphs, the polarization directions of the ferroelectric portions are different from each other.

In the ferroelectric portion 31 and the fourth layer 40, the shape of the barrier height BH varies with the polarization direction. In the ferroelectric portion 31, the inclination direction of the barrier height GH varies with the polarization direction. Therefore, rectification characteristics are produced in the stacked body of the ferroelectric portion 31 and the fourth layer 40.

Figure 16:
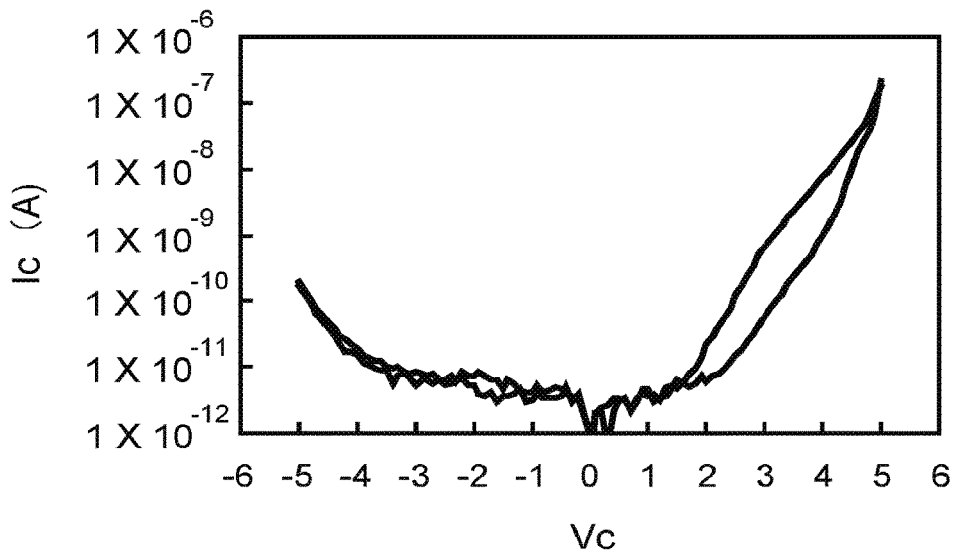
FIG. 16 is a graph showing the characteristics of the memory device according to the second embodiment.

FIG. 16 is a graph showing the characteristics of the memory device according to the second embodiment. FIG. 16 shows an example of measurement results for the electrical characteristics of the memory device 120. The horizontal axis in FIG. 16 is the voltage Vc applied to a single cell (ferroelectric portion 31) of the memory device 120. The vertical axis is the current Ic flowing through the cell.

As can be seen from FIG. 16, the current Ic is large when the voltage Vc is positive, and the current Ic is small when the voltage Vc is negative. By providing the fourth layer 40 in this way, rectification characteristics are provided. For example, sneak current produced at the plurality of interconnections can be reduced in cross point type memory devices.

FIG. 17A and FIG. 17B are schematic cross-sectional views illustrating a method of manufacturing the memory device according to the second embodiment.

FIG. 17A and FIG. 17B correspond to the cross-sections illustrated in FIG. 14A and FIG. 14B respectively.

The first layer 10u is formed in the same way as described for the first embodiment. In the embodiment, the fourth layer 40 is formed on the first layer 10u. Then the film 30f is formed on the fourth layer 40. Then the second layer 20u is formed on the film 30f in the same way as described for the first embodiment. Then, in this state, annealing is carried out, to form the ferroelectric portion 31 and the paraelectric portion 32 from the film 30f.

In this case also, the ferroelectric portion 31 is formed in the regions between the first interconnections 11 and the second interconnections 21, and the paraelectric portion 32 is formed in the other regions. The thickness of the fourth layer 40 is sufficiently small, so in the third layer 30u the difference in stress (difference in strain) can be formed.

In this example, the fourth layer 40 is provided between the first layer 10u and the third layer 30u, and each of the plurality of second interconnections 21 is in contact with the ferroelectric portion 31. In other words, at least one of the first interconnections 11 and the second interconnections 21 contact the ferroelectric portion 31. In this way, the strain formed in the ferroelectric portion 31 can be increased, and the ferroelectric portion 31 can be stably formed.

Third Embodiment

The embodiment is a method of manufacturing a semiconductor memory device.

FIG. 18 is a flowchart illustrating a method for manufacturing a memory device according to a third embodiment.

First, the first layer 10u is formed (step S110). The first layer 10u includes the plurality of first interconnections 11 and the first insulating portion 12. The plurality of first interconnections 11 extend in the first direction D1, and are separated from each other in the direction that crosses the first direction D1 (first crossing direction). The first insulating portion 12 is provided between the plurality of the first interconnections 11.

The film 30f is formed on the first layer 10u (step S120). Hafnium oxide may, for example, be included in the film 30f.

The second layer 20u is formed on the film 30f (step S130). The second layer 20u includes the plurality of second interconnections 21 and the second insulating portion 22. The plurality of second interconnections 21 extend in the second direction D2 that crosses the first direction D1, and are separated from each other in the direction that crosses with the second direction D2 (second crossing direction). The second insulating portion 22 is provided between the plurality of second interconnections 21.

The first layer 10u, the film 30f, and the second layer 20u are annealed (step S140). As a result, the ferroelectric portion 31 and the paraelectric portion 32 are formed from the film 30f. The ferroelectric portion 31 is provided between each of the plurality of first interconnections 11 and each of the plurality of second interconnections 21. The resistance of the ferroelectric portion 31 can be varied. The paraelectric portion 32 is provided between the first insulating portion 12 and the plurality of second interconnections 21, between the second insulating portion 22 and the plurality of first interconnections 11, and between the first insulating portion 12 and the second insulating portion 22.

According to the embodiment, the memory device can be manufactured with high productivity. In the manufactured memory device 120, interference between adjacent cells can be suppressed. Also leakage between bit lines and between word lines can be suppressed. In this way, high operational stability can be obtained.

In the embodiment, for example, TiN is also used in the plurality of the first interconnections 11 and the plurality of the second interconnections 21.

The material used in the ferroelectric portion 31 and the paraelectric portion 32 (hafnium oxide) may further include at least one element selected from the group consisting of Si, Al, Zr, Gd, Y, and Sr. For example, the ferroelectric portion 31 has an orthorhombic crystal structure, and the paraelectric portion 32 has a monoclinic crystal structure.

In the embodiment, in addition, the paraelectric fourth layer 40 may be formed between the first layer 10u and the film 30f. The thickness of the fourth layer 40 is, for example, not less than 0.5 and not more than 2.0 nm. On the other hand, the thickness of the first insulating portion 12 is not less than 10 nm. In this case, for example, each of the plurality of second interconnections 21 is in contact with a ferroelectric portion 31. The ferroelectric portion 31 can be stably formed.

According to the embodiment, high operational stability can be obtained in the two-terminal FJT element using the ferroelectric thin film. Also, high productivity can be obtained. By using the FJT element, low current, low voltage driving, and high-speed switching are possible.

According to the embodiment, it is possible to provide a highly stable memory device and manufacturing method for same.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in memory devices such as interconnection layers, interconnections, ferroelectric portions, paraelectric portions, substrates, interlayer insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all memory devices and manufacturing methods for same practicable by an appropriate design modification by one skilled in the art based on the memory devices and manufacturing methods for same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device comprising:
a first layer;
a second layer;
a third layer provided between the first layer and the second layer; and
a fourth layer provided between the first layer and the third layer, the fourth layer being paraelectric,
the first layer including
a first interconnection portion extending in a first direction,
a second interconnection portion extending in the first direction and separated from the first interconnection portion in a first crossing direction crossing the first direction, and
a first insulating portion provided between the first interconnection portion and the second interconnection portion,
the second layer including
a third interconnection portion extending in a second direction crossing the first direction,
a fourth interconnection portion extending in the second direction and separated from the third interconnection portion in a second crossing direction crossing the second direction, and
a second insulating portion provided between the third interconnection portion and the fourth interconnection portion, the second layer being separated from the first layer in a third direction crossing a plane including the first direction and the first crossing direction, the third layer including a first partial portion and a second partial portion,
the first partial portion including a first material including a first hafnium oxide, the first partial portion being provided between the first interconnection portion and the third interconnection portion, being provided between the first interconnection portion and the fourth interconnection portion, being provided between the second interconnection portion and the third interconnection portion, and being provided between the second interconnection portion and the fourth interconnection portion, and
the second partial portion including a second material including a second hafnium oxide, the second partial portion being provided between the first insulating portion and the third interconnection portion, being provided between the first insulating portion and the fourth interconnection portion, being provided between the second insulating portion and the first interconnection portion, being provided between the second insulating portion and the second interconnection portion, and being provided between the first insulating portion and the second insulating portion.

2. The device according to claim 1, wherein the first to fourth interconnection portions include TiN.

3. The device according to claim 1, wherein the first and second materials include at least one selected from the group consisting of Si, Al, Zr, Gd, Y. and Sr.

4. The device according to claim 1, wherein
a crystalline structure of the first partial portion is different from a crystalline structure of the second partial portion.

5. The device according to claim 1, wherein a dielectric constant of the first partial portion is higher than a dielectric constant of the second partial portion.

6. The device according to claim 1, wherein a thickness of the fourth layer is not less than 0.5 nanometers and not more than 2.0 nanometers.

7. The device according to claim 1, wherein
the third interconnection portion and the fourth interconnection portion contact the first partial portion.

8. The device according to claim 1, wherein
a thickness of each of the first interconnection portion and the second interconnection portion is not less than 10 nanometers, and
a thickness of the first insulating portion is not less than 10 nanometers.

9. The device according to claim 1, wherein
a thickness of each of the first interconnection portion and the second interconnection portion is not less than 50 and not more than 500 nanometers, and
a thickness of the first insulating portion is not less than 50 and not more than 500 nanometers.

10. The device according to claim 1, wherein a thickness of the third layer is not less than 1 and not more than 50 nanometers.

11. The device according to claim 1, wherein the first partial portion and the second partial portion are connected to each other.

12. The device according to claim 1, wherein the first insulating portion and the second insulating portion include silicon oxide.

13. The device according to claim 1, wherein a first composition of the second hafnium oxide is same as a second composition of the second hafnium oxide.

14. The device according to claim 13, wherein
the first partial portion is ferroelectric, and
the second partial portion is paraelectric.

15. The device according to claim 14, wherein an electrical resistance of the first partial portion is changeable.

16. The device according to claim 13, wherein the first partial portion has an orthorhombic crystal structure.

17. The device according to claim 16, wherein the second partial portion has a monoclinic crystal structure.

* * * * *